(12) United States Patent
Kawamoto et al.

(10) Patent No.: US 11,955,949 B2
(45) Date of Patent: Apr. 9, 2024

(54) RESONATOR, AND FILTER AND DUPLEXER HAVING THE SAME

(71) Applicant: WISOL CO., LTD., Osan-si (KR)

(72) Inventors: Toshihiko Kawamoto, Osan-si (KR); Ryota Sato, Osan-si (KR); Sang Tai Yu, Osan-si (KR); Je Cheol Lee, Osan-si (KR)

(73) Assignee: WISOL CO., LTD., Osan-si (KR)

( * ) Notice: Subject to any disclaimer, the term of this patent is extended or adjusted under 35 U.S.C. 154(b) by 594 days.

(21) Appl. No.: 17/320,485

(22) Filed: May 14, 2021

(65) Prior Publication Data

US 2021/0367580 A1 Nov. 25, 2021

(30) Foreign Application Priority Data

May 20, 2020 (KR) .......................... 10-2020-0060365

(51) Int. Cl.
*H03H 9/145* (2006.01)
*H03H 9/25* (2006.01)

(52) U.S. Cl.
CPC .............. *H03H 9/145* (2013.01); *H03H 9/25* (2013.01)

(58) Field of Classification Search
CPC .................................. H03H 9/145; H03H 9/25
USPC ...... 310/313 R, 313 A, 313 B, 313 C, 313 D
See application file for complete search history.

(56) References Cited

U.S. PATENT DOCUMENTS

2011/0156842 A1* 6/2011 Takamine .......... H03H 9/14535
333/195

FOREIGN PATENT DOCUMENTS

KR 10-2012-0114729 A 10/2012

* cited by examiner

*Primary Examiner* — Derek J Rosenau
(74) *Attorney, Agent, or Firm* — LRK PATENT LAW FIRM (57) ABSTRACT

A resonator includes: interdigital transducer (IDT) including first electrode including first base on piezoelectric substrate and extended in reference direction, and first protrusions connected to the first base and extended in direction intersecting with the reference direction, and second electrode including second base on the piezoelectric substrate and extended in the reference direction, and second protrusions connected to the second base and extended in direction intersecting with the reference direction, each of the second protrusions extended to have one of the first protrusions inserted between the second protrusion and another second protrusion adjacent to the second protrusion, wherein a width of each of first specific protrusions included between one end of the IDT and first position at first distance from the one end, among the first protrusions and the second protrusions, decreases from first specific protrusion closest to the first position toward first specific protrusion closest to the one end.

6 Claims, 13 Drawing Sheets

|  |  |  |
|---|---|---|
| Same as first method | "Spurious" is small, and same as second method | "Spurious" is large and severe |

RESONATOR, AND FILTER AND DUPLEXER HAVING THE SAME

CROSS-REFERENCE TO RELATED APPLICATION(S)

This application claims priority to Korean Patent Application No. 10-2020-0060365, filed May 20, 2020, in Korean Intellectual Property Office, the disclosure of which is incorporated herein by reference for all purposes.

BACKGROUND OF THE INVENTION

1. Field of the Invention

The technique disclosed in this application generally relates to a Surface Acoustic Wave (SAW) resonator and a filter and a duplexer having the resonator.

2. Description of Related Art

A resonator according to the prior art includes an interdigital transducer (IDT) formed on a substrate, a first reflector formed on the substrate to face one end of the IDT, and a second reflector formed on the substrate to face the other end of the IDT.

Recently, resonators with further higher performance are required.

Therefore, the technique disclosed in this application provides a resonator (surface acoustic wave resonator) with improved performance.

SUMMARY OF THE INVENTION

An object of the present invention to provide a resonator (surface acoustic wave resonator) with improved performance.

Another object of the present invention is to provide a resonator capable of reducing "Spurious" of a filter.

Still another object of the present invention is to provide a resonator in which electrostatic discharge (ESD) and power durability characteristics are not degraded.

The problems of the present invention are not limited to the problems mentioned above, and unmentioned other problems will be clearly understood by those skilled in the art from the following description.

To accomplish the above objects, according to one aspect of the present invention, there is provided a resonator comprising: an interdigital transducer (IDT) including a first electrode including a first base formed on a piezoelectric substrate and extended in a reference direction, and a plurality of first protrusions connected to the first base and extended in a direction intersecting with the reference direction, and a second electrode including a second base formed on the piezoelectric substrate and extended in the reference direction, and a plurality of second protrusions connected to the second base and extended in a direction intersecting with the reference direction, each of the second protrusions being extended to have any one first protrusion among the plurality of first protrusions inserted between the second protrusion and another second protrusion adjacent to the second protrusion, wherein a width, along the reference direction, of each of a plurality of first specific protrusions included between one end of the IDT and a first position at a first distance from the one end, among the plurality of first protrusions and the plurality of second protrusions, decreases from a first specific protrusion closest to the first position toward a first specific protrusion closest to the one end.

In an embodiment, a width, along the reference direction, of each of a plurality of second specific protrusions included between the other end facing the one end of the IDT and a second position at a second distance from the other end, among the plurality of first protrusions and the plurality of second protrusions, decreases from a second specific protrusion closest to the second position toward a second specific protrusion closest to the other end.

In an embodiment, the width along the reference direction of each of the first protrusions, among the plurality of first protrusions, excluding the plurality of first specific protrusions is almost the same.

In an embodiment, the width along the reference direction of each of the second protrusions, among the plurality of second protrusions, excluding the plurality of second specific protrusions is almost the same.

In an embodiment, a pitch formed between each of the first protrusions and a first protrusion adjacent to the first protrusion is almost the same, and a pitch formed between each of the second protrusions and a second protrusion adjacent to the second protrusion is almost the same.

In an embodiment, the resonator further comprises: a first reflector formed on the piezoelectric substrate to face the one end of the IDT; and a second reflector formed on the piezoelectric substrate to face the other end of the IDT.

In an embodiment, the piezoelectric substrate is formed of $LiTAO_3$ or $LiNaO_3$.

In a filter according to an embodiment of the present invention, the resonator comprises: an interdigital transducer (IDT) including a first electrode including a first base formed on a piezoelectric substrate and extended in a reference direction, and a plurality of first protrusions connected to the first base and extended in a direction intersecting with the reference direction, and a second electrode including a second base formed on the piezoelectric substrate and extended in the reference direction, and a plurality of second protrusions connected to the second base and extended in a direction intersecting with the reference direction, each of the second protrusions being extended to have any one first protrusion among the plurality of first protrusions inserted between the second protrusion and another second protrusion adjacent to the second protrusion, wherein a width, along the reference direction, of each of a plurality of first specific protrusions included between one end of the IDT and a first position at a first distance from the one end, among the plurality of first protrusions and the plurality of second protrusions, decreases from a first specific protrusion closest to the first position toward a first specific protrusion closest to the one end.

A duplexer according to an embodiment of the present invention is a duplexer having a resonator, and the resonator comprises: an interdigital transducer (IDT) including a first electrode including a first base formed on a piezoelectric substrate and extended in a reference direction, and a plurality of first protrusions connected to the first base and extended in a direction intersecting with the reference direction, and a second electrode including a second base formed on the piezoelectric substrate and extended in the reference direction, and a plurality of second protrusions connected to the second base and extended in a direction intersecting with the reference direction, each of the second protrusions being extended to have any one first protrusion among the plurality of first protrusions inserted between the second protrusion and another second protrusion adjacent to the second protrusion, wherein a width, along the reference direction, of each of a plurality of first specific protrusions included between one end of the IDT and a first position at a first distance from the one end, among the plurality of first protrusions and the plurality of second protrusions, decreases from a first specific protrusion closest to the first position toward a first specific protrusion closest to the one end.

DETAILED DESCRIPTION OF THE PREFERRED EMBODIMENT

Hereinafter, various embodiments of the present invention will be described with reference to the accompanying drawings. In the drawings, common components are assigned with the same reference numeral. In addition, it should be noted that components expressed in a certain drawing may be omitted in another drawing for convenience of explanation. In addition, it should also be noted that the accompanying drawings are not necessarily drawn in an accurate scale.

Unless otherwise defined, all the terms (including technical and scientific terms) used in this specification may be used as a meaning that can be commonly understood by those skill in the art. In addition, the terms defined in a commonly used dictionary are not interpreted ideally or excessively unless explicitly and specifically defined. The terms used in this specification are for describing embodiments and are not intended to limit the present invention. In this specification, singular forms also include plural forms unless specifically stated in a phrase.

The terms "comprises" and "comprising" used in this specification do not exclude presence or addition of one or more other components, steps, operations or elements with regard to mentioned components, steps, operations or elements.

1. About Terms

Figure 1:
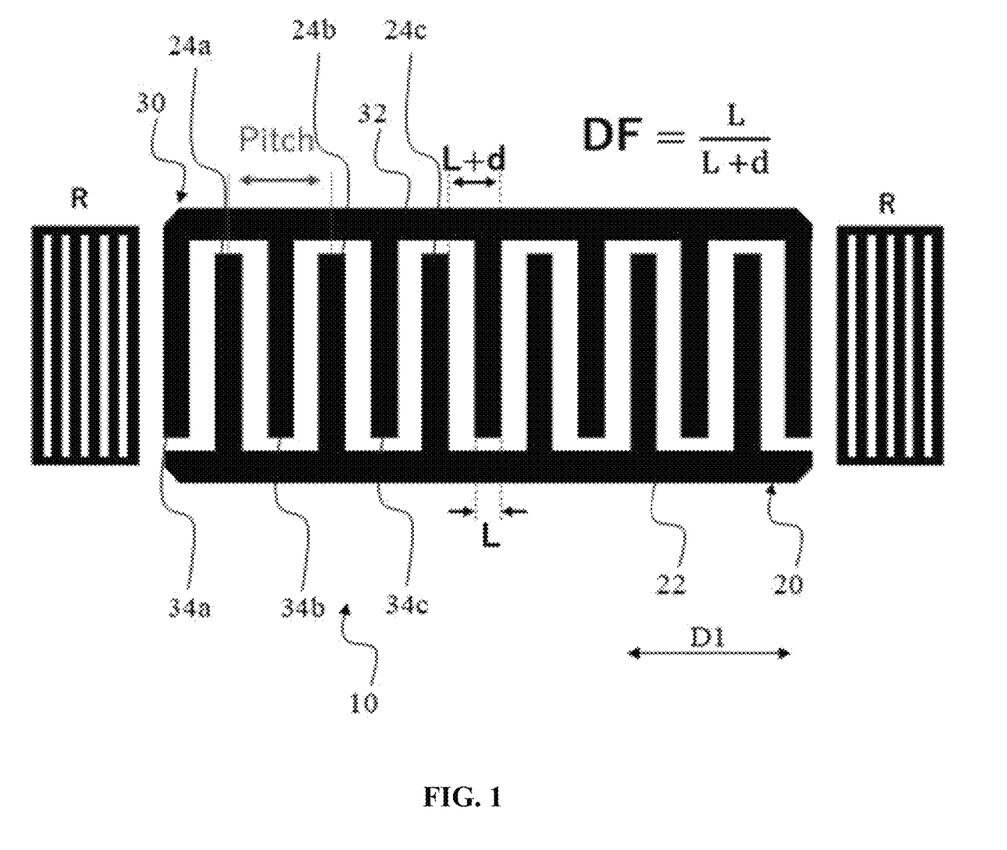
FIG. 1 is a mimetic view describing the terms used for a surface acoustic wave (SAW) interdigital transducer (IDT) in this application.

FIG. 1 is a mimetic view describing the terms used for a surface acoustic wave (SAW) interdigital transducer (IDT) in this application.

(1) Basic Configuration

As shown in FIG. 1, a SAW IDT 10 mainly includes a first electrode 20 and a second electrode 30. The first electrode 20 includes a first base 22 formed on a piezoelectric substrate and extended in a reference direction D1, and a plurality of first protrusions 24 (24a, 24b, 24c, ... ) coupled to the first base 22 and extended in a direction intersecting with the reference direction D1.

The second electrode 30 includes a second base 32 formed on the piezoelectric substrate and extended in the reference direction D1, and a plurality of second protrusions 34 (34a, 34b, 34c, ... ) coupled to the second base 32 and extended in a direction intersecting with the reference direction D1. In addition, each of the second protrusions 34 is extended to have any one first protrusion 24, among the plurality of first protrusions 24, inserted between the second protrusion 34 and another second protrusion 34 adjacent to the second protrusion 34. For example, the second protrusion 34a is extended to have the first protrusion 24a inserted between the second protrusion 34a and another second protrusion 34b adjacent to the second protrusion 34a.

(2) Width of Protrusion

The width L of each first protrusion 24 refers to the length of the first protrusion 24 along the reference direction D1. Similarly, the width L of each second protrusion 34 refers to the length of the second protrusion 34 along the reference direction D1.

(2) Pitch of Protrusions

The pitch λ formed between two adjacent first protrusions 24 refers to the distance between the central axis of a first protrusion 24 on one side and the central axis of a first protrusion 24 on the other side. In addition, the central axis of each first protrusion 24 is extended in a direction perpendicular to the reference direction D1.

In the same manner, the pitch formed between two adjacent second protrusions 34 refers to the distance between the central axis of a second protrusion 34 on one side and the central axis of a second protrusion 34 on the other side. In addition, the central axis of each second protrusion 34 is extended in a direction perpendicular to the reference direction D1.

(4) Duty Factor of Protrusion

The duty factor (DF) of a target protrusion among the first protrusion 24 and the second protrusion 34 is defined by the following equation.

$$DF=L/(L+d)$$

Here, L is the width of the target protrusion (first protrusion or second protrusion).

In addition, d is the distance between the target protrusion (first protrusion or second protrusion) and a protrusion adjacent to the target protrusion (when the target protrusion is the first protrusion, the second protrusion adjacent to the first protrusion, and when the target protrusion is the second protrusion, the first protrusion adjacent to the second protrusion). In other words, d is a distance along the reference direction D1 of a gap formed between the target protrusion and a protrusion adjacent to the target protrusion.

2. Resonator According to First Method

Figure 2:
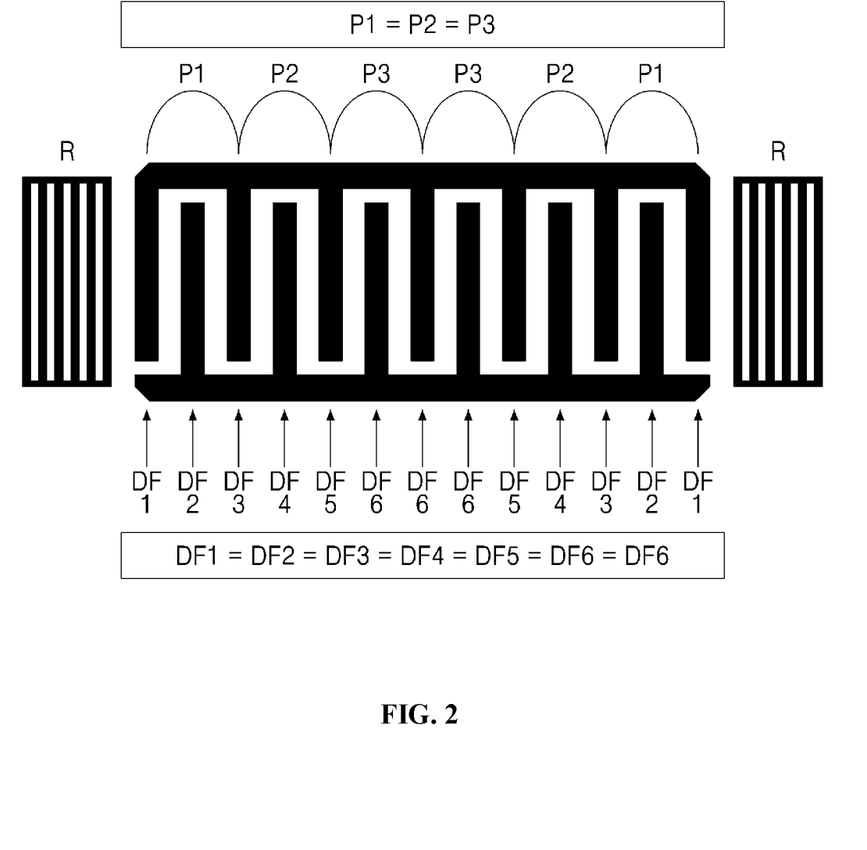
FIG. 2 is a mimetic view showing the configuration of a resonator according to a first method.

FIG. 2 is a mimetic view showing the configuration of a resonator according to a first method.

As shown in FIG. 2, the pitch λ formed between two adjacent first protrusions is constant. In addition, the pitch λ formed between two adjacent second protrusions is also constant. In addition, the DF of each protrusion included in the plurality of first protrusions and the plurality of second protrusions is also constant.

Figure 3:
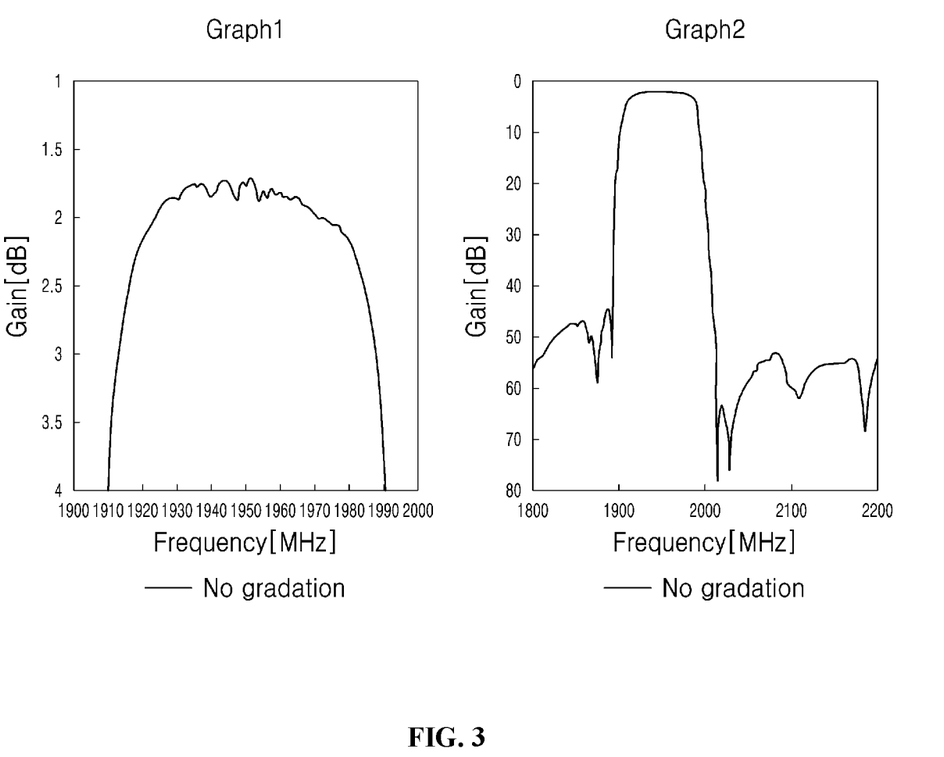
FIG. 3 is a graph showing the characteristics of a filter using a resonator according to the first method shown in FIG. 2.

Since the wavelength λ (pitch) of the resonator shown in FIG. 2 is constant, in a filter using this resonator, "Spurious" is generated in the transmission band as shown in FIG. 3. There is a limit in reducing the "Spurious" although the pitch λ of two reflectors installed at both ends of the SAW IDT to face each other is considered. In the graphs shown in FIG. 3, the horizontal axis represents the frequency [MHz], and the vertical axis represents the gain [dB].

2. Resonator According to Second Method

Figure 4:
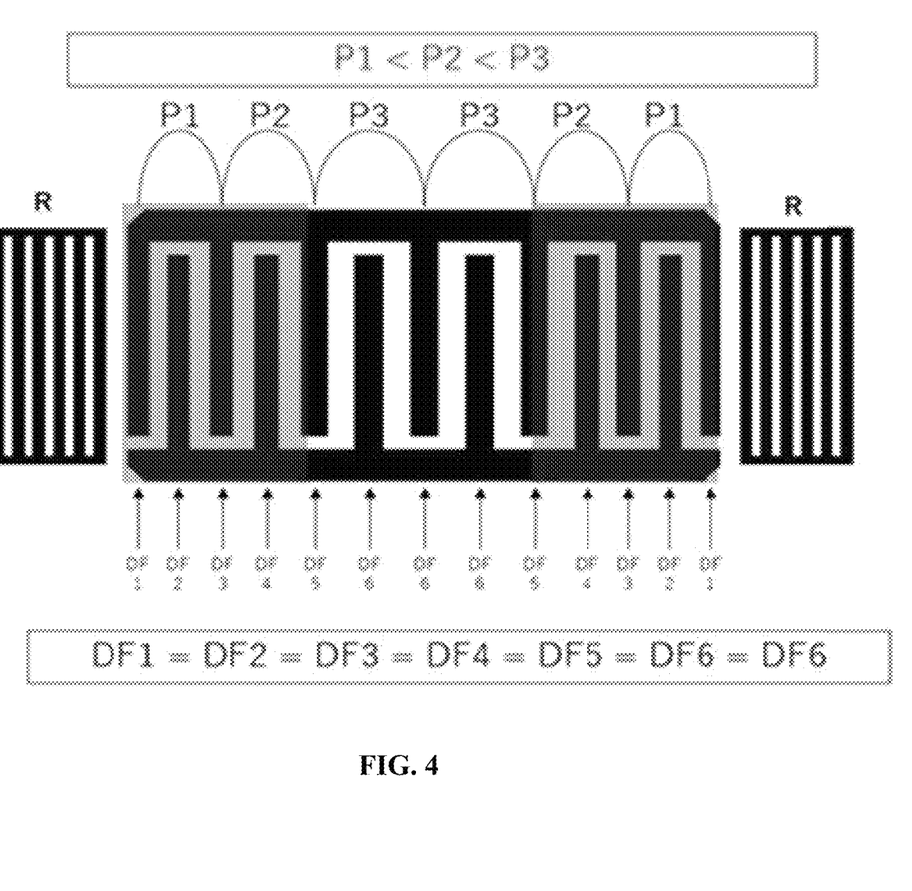
FIG. 4 is a mimetic view showing the configuration of a resonator according to a second method.

FIG. 4 is a mimetic view showing the configuration of a resonator according to a second method.

As shown in FIG. 4, in a resonator according to the second method, the DF of each protrusion included in the plurality of first protrusions and the plurality of second protrusions is constant like the resonator according to the first method. However, in the resonator according to the second method, for some of the Taps disposed near both ends of the SAW IDT, the pitch λ formed between two adjacent first protrusions and the pitch λ formed between two adjacent second protrusions gradually decrease toward the end portions.

Figure 5:
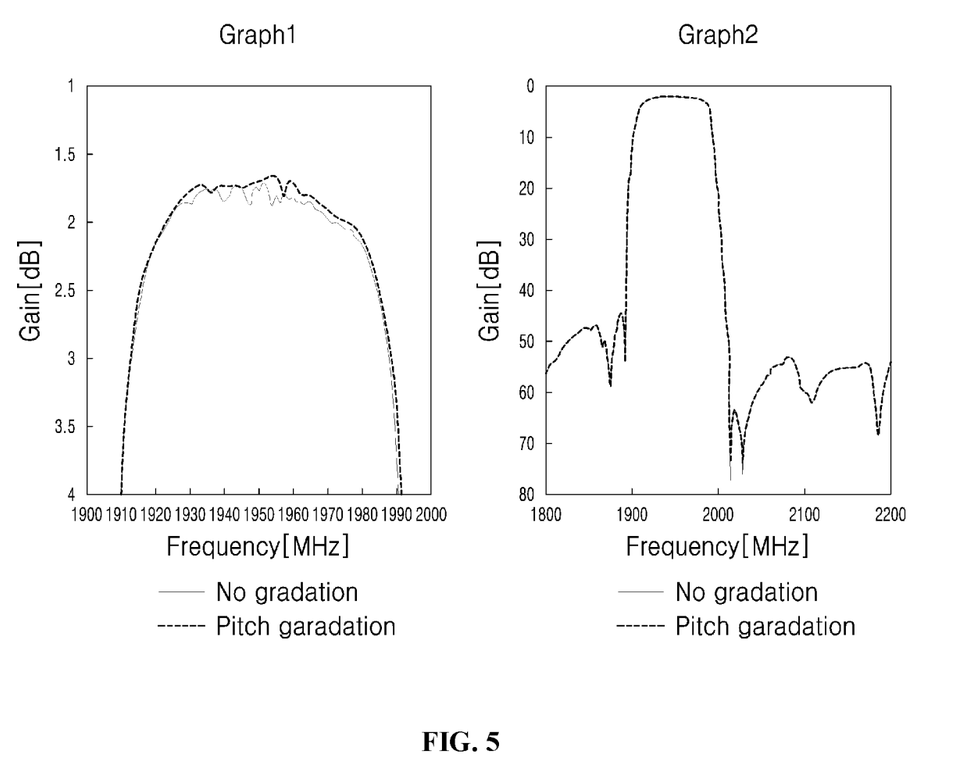
FIG. 5 is a graph showing the characteristics of a filter using a resonator according to the second method shown in FIG. 4.

As the wavelength λ (pitch) of the resonator decreases toward the end portions in this way, the frequency on the reflector side of the resonator changes. Accordingly, as shown in FIG. 5, in a filter using this resonator, as the "Spurious" generated in the transmission band can be reduced, the characteristics of the resonator can be improved. In the graphs shown in FIG. 5, the horizontal axis represents the frequency [MHz], and the vertical axis represents the gain [dB]. In addition, the dotted line indicates the characteristics of the resonator according to the first method, and the broken line indicates the characteristics of the resonator according to the second method.

However, in the case of adopting the second method, for some of the Taps disposed near both ends of the SAW IDT, the distance between each first protrusion on the first electrode (e.g., + electrode) and a first protrusion adjacent thereto and the distance between each second protrusion on the second electrode (e.g., − electrode) and a second protrusion adjacent thereto are reduced. Furthermore, the gap formed between two adjacent protrusions (first protrusion and second protrusion) is reduced. As a result, a problem related to electrostatic discharge (ESD) and power durability may occur.

4. Resonator According to an Embodiment

Figure 6:
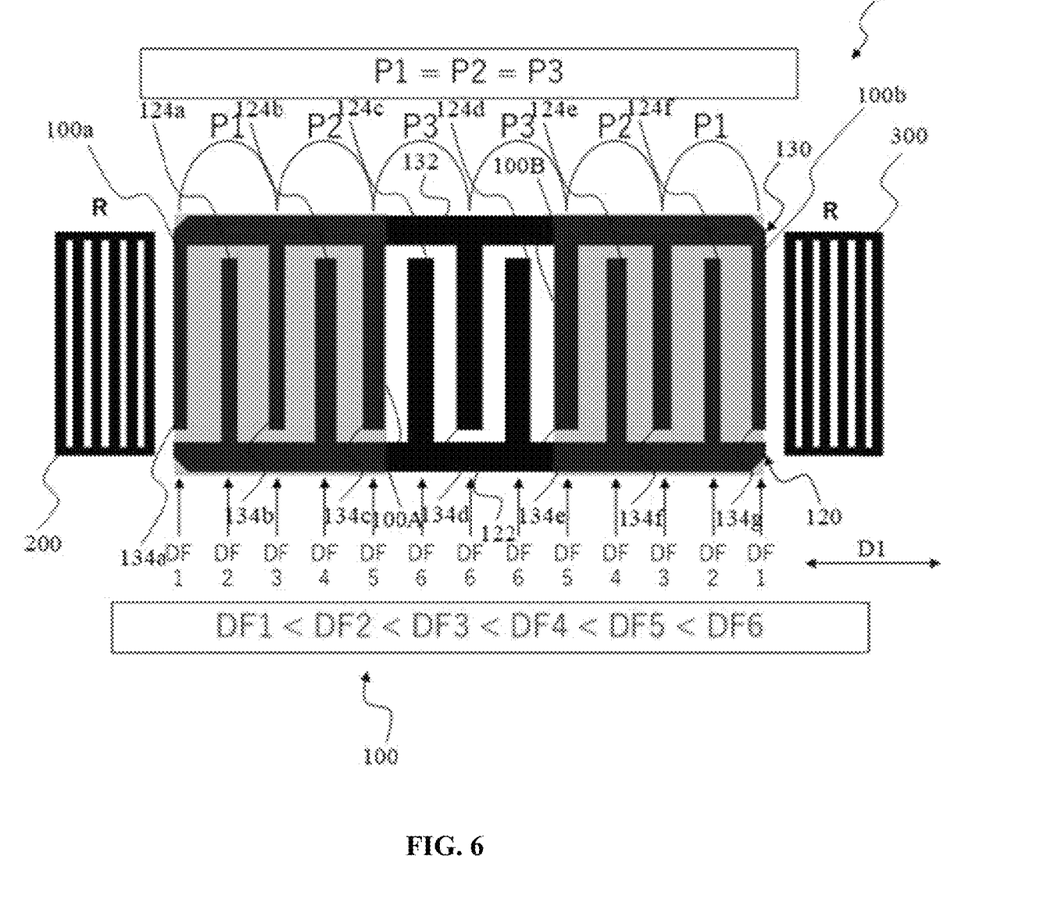
FIG. 6 is a mimetic view showing the configuration of a resonator according to an embodiment.

FIG. 6 is a mimetic view showing the configuration of a resonator according to an embodiment of the present invention. The resonator 1 shown in FIG. 6 may mainly include a SAW IDT 100 formed on a piezoelectric substrate (not shown), a first reflector 200 formed on the piezoelectric substrate to face one end 100a of the SAW IDT 100, and a second reflector 300 formed on the piezoelectric substrate to face the other end 100b of the SAW IDT 100. In addition, the piezoelectric substrate may be formed of, for example, $LiTAO_3$ or $LiNaO_3$.

The SAW IDT 100 may include a first electrode 120 and a second electrode 130. The first electrode 120 may include a first base 122 formed on the piezoelectric substrate and extended in a reference direction D1, and a plurality of first protrusions 124 (124a to 124f) coupled to the first base 122 and extended in a direction intersecting with the reference direction D1 (e.g., perpendicular direction or almost perpendicular direction).

Though an example in which the first electrode 120 has six first protrusions 124 is shown in FIG. 6 for simplicity of explanation, the first electrode 120 may have a predetermined number of, i.e., seven or more or five or less, first protrusions 124.

The second electrode 130 may include a second base 132 formed on the piezoelectric substrate and extended in the reference direction D1, and a plurality of second protrusions 134 (134a to 134g) coupled to the second base 132 and extended in a direction intersecting with the reference direction D1 (e.g., perpendicular direction or almost perpendicular direction). In addition, each of the second protrusions 134 may be extended to have any one first protrusion 124 among the plurality of first protrusions 124 inserted between the second protrusion 134 and another second protrusion 134 adjacent to the second protrusion 134. For example, the second protrusion 134a may be extended to have the first protrusion 124a inserted between the second protrusion 134a and the second protrusion 134b adjacent to the second protrusion 134a.

Though an example in which the second electrode 130 has seven second protrusions 134 is shown in FIG. 6 for simplicity of explanation, the second electrode 130 may have a predetermined number of, i.e., eight or more or six or less, second protrusions 134.

In the resonator 1 according to this embodiment, the pitch λ formed between two adjacent first protrusions 124 may be constant as an example. In addition, the pitch λ formed between two adjacent second protrusions 134 may be constant also as an example.

First of all, pay attention to one end 100a of the SAW IDT 100. A plurality of first protrusions 124 and a plurality of second protrusions 134 (hereinafter, referred to as a "first specific protrusion") are included between this one end 100a and a first position 100A at a first distance from this one end 100a along the reference direction D1. In the example shown in FIG. 6, the first specific protrusion includes a second protrusion 134c, a first protrusion 124b, a second protrusion 134b, a first protrusion 124a, and a second protrusion 134a from the first position 100A toward the one end 100a.

The width (length along the reference direction D1) of the plurality of first specific protrusions decreases (gradually decreases for example) from the first specific protrusion 134c closest to the first position 100A toward the first specific protrusion 134a closest to the one end 100a.

Next, pay attention to the other end 100b of the SAW IDT 100a. A plurality of first protrusions 124 and a plurality of second protrusions 134 (hereinafter, referred to as a "second specific protrusion") are included between the other end 100b and a second position 100B at a second distance from the other end 100b along the reference direction D1. In the example shown in FIG. 6, the second specific protrusion includes a second protrusion 134e, a first protrusion 124e, a second protrusion 134f, a first protrusion 124f, and a second protrusion 134g from the second position 100B toward the other end 100b.

The width (length along the reference direction D1) of the plurality of second specific protrusions decreases (gradually decreases for example) from the second specific protrusion 134e closest to the second position 100B toward the second specific protrusion 134g closest to the other end 100b.

Accordingly, a relation such as DF1<DF2<DF3<DF4<DF5<DF6 is established as shown in FIG. 6.

In addition, the distance between the one end 100a and the first position 100A and the distance between the other end 100b and the second position 100B may be set according to the characteristics related to the "Spurious" of the resonator. In addition, the distance between the one end 100a and the first position 100A and the distance between the other end 100b and the second position 100B may be set to be the same or different.

In addition, the protrusions other than the first specific protrusion and the second specific protrusion (in the example shown in FIG. 6, the first protrusion 124c, the first protrusion 124d, and the second protrusion 134d) may have almost the same width (width along the reference direction D1).

Figure 7:
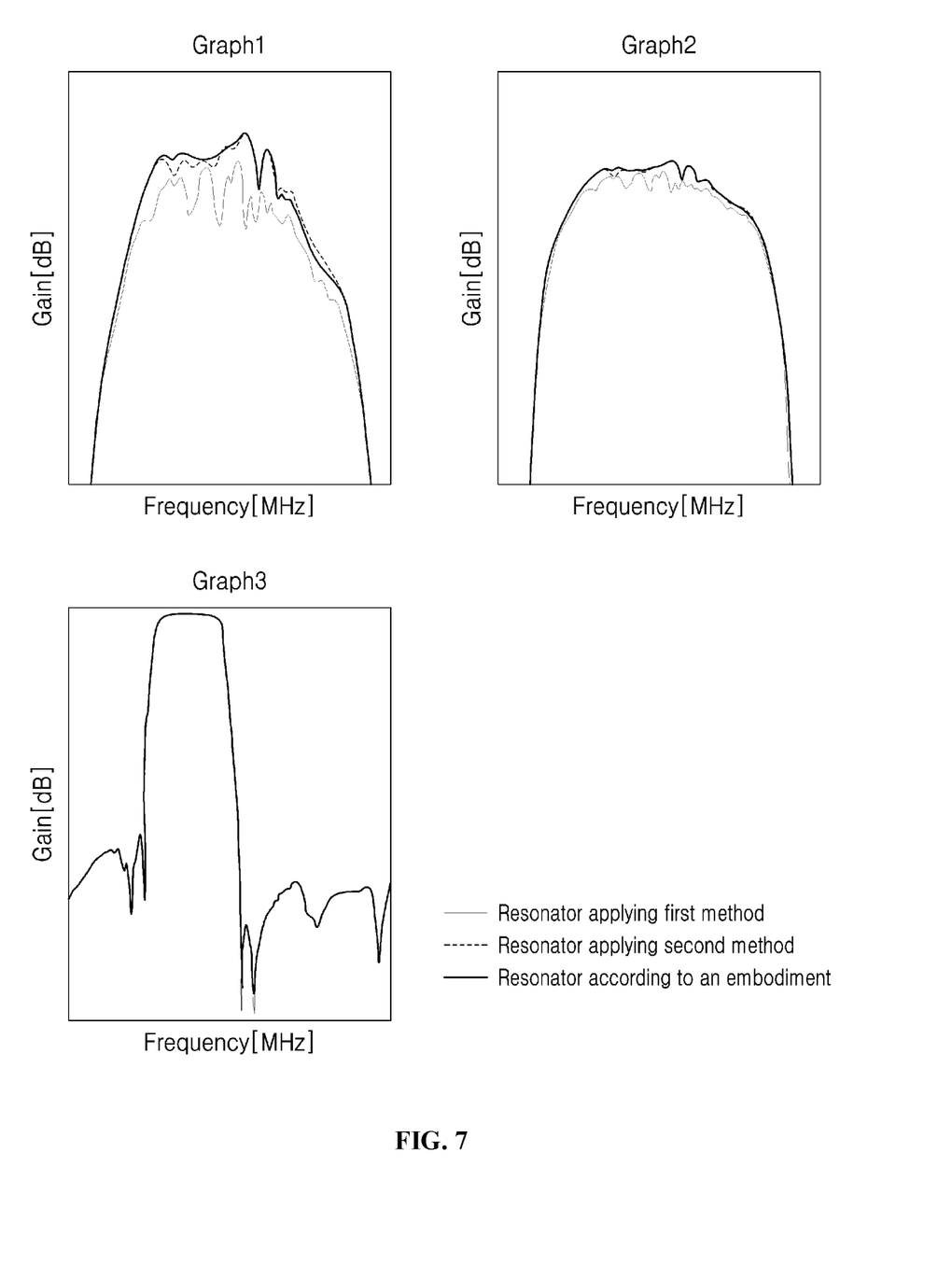
FIG. 7 is a graph showing the characteristics of a filter using the resonator shown in FIG. 6 compared with the characteristics of filters using resonators applying the first method and the second method.

FIG. 7 is a graph showing the characteristics of a filter using the resonator shown in FIG. 6 compared with the characteristics of filters using resonators applying the first method and the second method. In FIG. 7, the horizontal axis represents the frequency [MHz], and the vertical axis represents the gain [dB]. In addition, the dotted line indicates the characteristics of a filter using the resonator applying the first method described above, the broken line indicates the characteristics of a filter using the resonator applying the second method described above, and the solid line indicates the characteristics of a filter using the resonator 1 according to an embodiment of the present invention.

In the resonator 1 according to an embodiment of the present invention, as described above, the width of the first specific protrusion of the SAW IDT 100 is configured to decrease from the first specific protrusion closest to the first position 100A toward the first specific protrusion closest to one end 100a, and in addition, the width of the second specific protrusion of the SAW IDT 100 is configured to decrease from the second specific protrusion closest to the second position 100B toward the second specific protrusion closest to the other end 100b. Accordingly, in the resonator 1 according to an embodiment, the frequency changes between the one end 100a and the first position 100A of the SAW IDT 100 and between the other end 100b and the second position 100B like the resonator applying the second method. Accordingly, as shown in FIG. 7, in the filter using the resonator 1 according to an embodiment of the present invention, it is possible to reduce the "Spurious" generated in the band.

In addition, as shown in FIG. 6, between the one end 100a and the first position 100A, the pitch λ formed between each first protrusion 124 on the first electrode 120 (e.g., + electrode) and a first protrusion 124 adjacent thereto is constant. In addition, the pitch λ formed between each second protrusion 134 on the second electrode 130 (e.g., − electrode) and a second protrusion 134 adjacent thereto is also constant. Accordingly, the gap formed between the first protrusion and the second protrusion adjacent to each other increases.

In the same manner, also between the other end 100b and the second position 100B, the pitch λ formed between each first protrusion 124 on the first electrode 120 (e.g., + electrode) and a first protrusion 124 adjacent thereto is also constant. In addition, the pitch λ formed between each second protrusion 134 on the second electrode 130 (e.g., + electrode) and a second protrusion 134 adjacent thereto is also constant. Accordingly, the gap formed between the first protrusion and the second protrusion adjacent to each other increases. Accordingly, it is possible to suppress degradation of the characteristics related to electrostatic discharge (ESD) and power durability.

5. Experiment Result

According to the experiment result, it is proved that the characteristics of the resonator 1 according to an embodiment of the present invention may be optimized by combining following two factors (factor X and factor Y).

Factor X: (DF Gradation Tap/Number of Total Taps)×100(%)     (1)

Here, the "DF Gradation Tap" is the sum of, in the SAW IDT 100, the number of Taps of all protrusions 124 and 134 existing between one end 100a and the first position 100A and the number of Taps of all protrusions 124 and 134 existing between the other end 100b and the second position 100B. In addition, the "Number of Total Taps" is the number of Taps of all protrusions 124 and 134 existing between one end 100a and the other end 100b in the SAW IDT 100.

Figure 8:
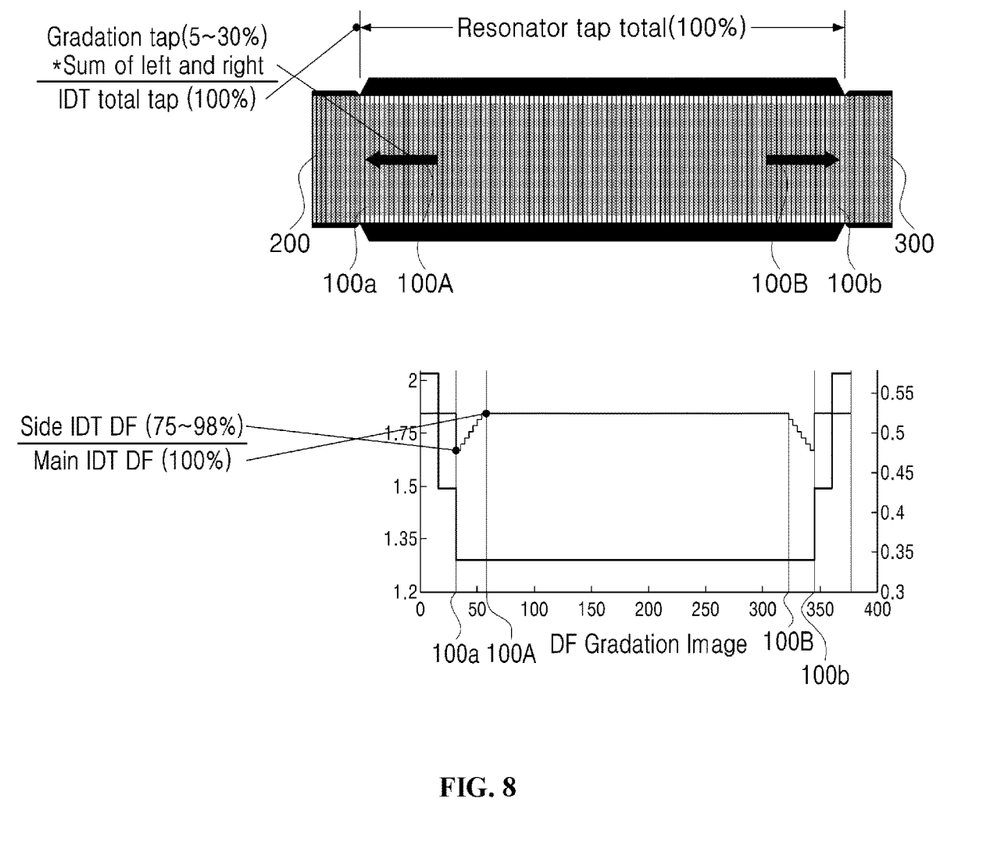
FIG. 8 is a mimetic view describing a factor for optimizing the characteristics of the resonator according to the embodiment shown in FIG. 6.

The concept of factor X is shown in the upper part of FIG. 8.

Factor Y: (Side IDT DF/Main IDT DF)×100(%)     (2)

Here, the "Side IDT DF" is the Duty Factor (DF) of each of the protrusions 124 and 134 positioned at one end 100a and the other end 100b of the SAW IDT 100. In addition, the "Main IDT DF" is the DF of each of the protrusions 124 and 134 positioned between the first position 100A and the second position 100B of the SAW IDT 100.

The concept of factor Y is shown in the lower part of FIG. 8. In addition, when the DF of the protrusion at the first position 100A and the DF of the protrusion at the one end 100a are determined, the DF of each of the other protrusions existing between the first position 100A and the one end 100a may be determined, for example, to be approximately inverse-proportional to the distance from the first position 100A. In this case, two or more adjacent protrusions may have almost the same DF.

In the lower part of FIG. 8, the DF of each of the protrusions between the first position 100A and the one end 100a changes in the shape of step since the DF of each protrusion having a constant width along the reference direction D1 is constant in the width.

In addition, in the same manner, when the DF of the protrusion at the second position 100B and the DF of the protrusion at the other end 100b are determined, the DF of each of the other protrusions existing between the second position 100B and the other end 100b may be determined, for example, to be approximately inverse-proportional to the distance from the second position 100B. In this case, two or more adjacent protrusions may have almost the same DF.

In the lower part of FIG. 8, the DF of each of the protrusions between the second position 100B and the other end 100*b* changes in the shape of step since the DF of each protrusion having a constant width along the reference direction D1 is constant in the width.

Figure 9:
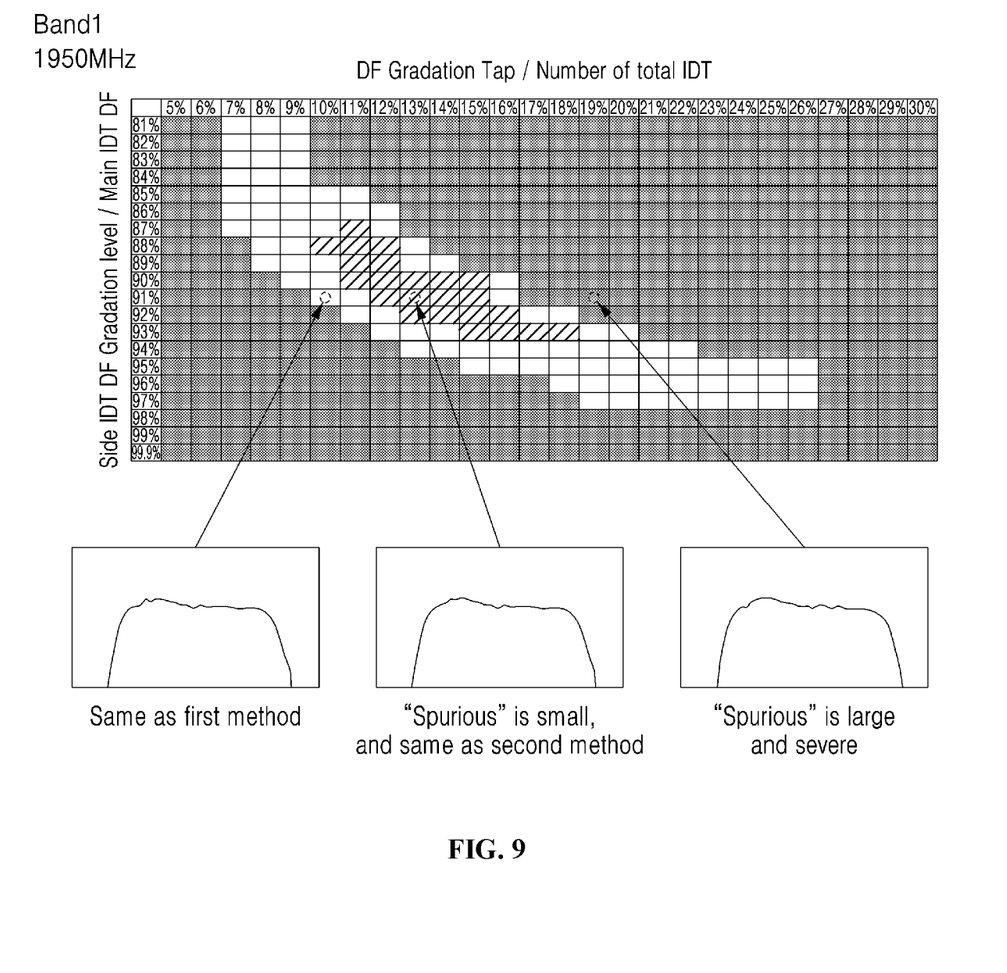
FIG. 9 is a view showing an experiment result of a first application example of the resonator according to the embodiment shown in FIG. 6.

FIG. 9 is a view showing an experiment result of a first application example of the resonator according to the embodiment shown in FIG. 6. Specifically, FIG. 9 shows an experiment result when the resonator according to the embodiment shown in FIG. 6 is applied to a duplexer used for Band1 (1950 MHz). In FIG. 9, the horizontal axis represents factor X (%), and the vertical axis represents factor Y (%).

As shown in FIG. 9, characteristics of "Spurious" the same as those obtained in the case of applying the first method described above are obtained by using a combination of factor X and factor Y corresponding to the white border. In addition, characteristics of "Spurious" the same as those obtained in the case of applying the second method described above are obtained by using a combination of factor X and factor Y corresponding to the border to which hatching (slash) is applied. In addition, a characteristic of generating undesirable "Spurious" is obtained by using a combination of factor X and factor Y corresponding to the gray (shaded) border. Accordingly, it can be clearly understood that there is a critical significance in using a combination of factor X and factor Y corresponding to the white border adjacent to the gray border or the border applied with hatching (slash).

Therefore, for this frequency band, it is preferable to use a combination of factor X and factor Y corresponding to the white border, and more preferable to use a combination of factor X and factor Y corresponding to the border applied with hatching.

Figure 10:
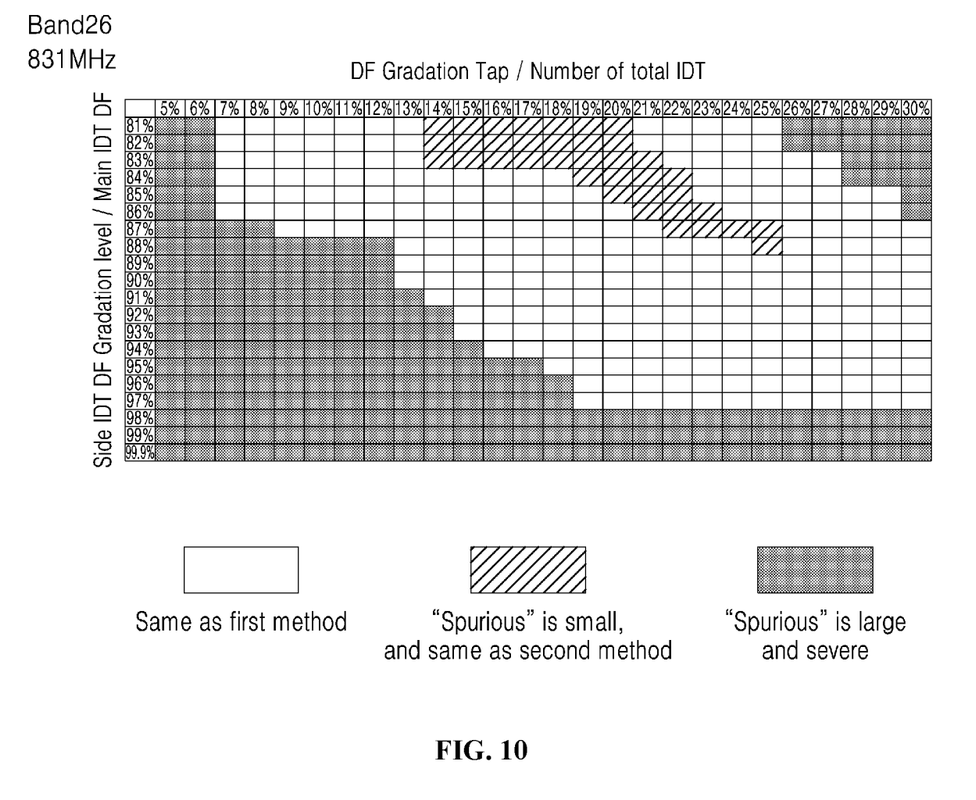
FIG. 10 is a view showing an experiment result of a second application example of the resonator according to the embodiment shown in FIG. 6.

FIG. 10 is a view showing an experiment result of a second application example of the resonator according to the embodiment shown in FIG. 6. Specifically, FIG. 10 shows an experiment result when the resonator according to the embodiment shown in FIG. 6 is applied to a duplexer used for Band26 (832 MHz). In FIG. 10, the horizontal axis represents factor X (%), and the vertical axis represents factor Y (%). The analysis method of FIG. 10 is the same as the analysis method of FIG. 9 described above. Also, it can be clearly understood that there is a critical significance in using a combination of factor X and factor Y corresponding to the white border adjacent to the gray border or the border applied with hatching.

Therefore, also for this frequency band, it is preferable to use a combination of factor X and factor Y corresponding to the white border, and more preferable to use a combination of factor X and factor Y corresponding to the border applied with hatching.

Figure 11:
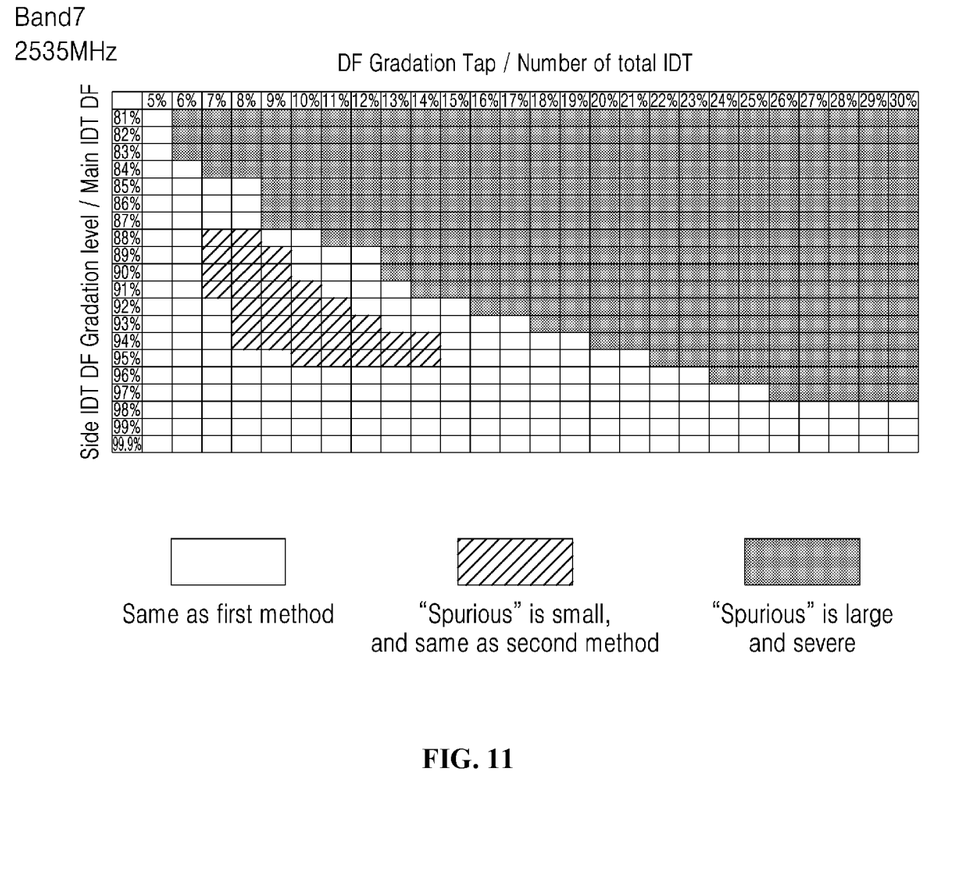
FIG. 11 is a view showing an experiment result of a third application example of the resonator according to the embodiment shown in FIG. 6.

FIG. 11 is a view showing an experiment result of a third application example of the resonator according to the embodiment shown in FIG. 6. Specifically, FIG. 11 shows an experiment result when the resonator according to the embodiment shown in FIG. 6 is applied to a duplexer used for Band1 (2535 MHz). In FIG. 11, the horizontal axis represents factor X (%), and the vertical axis represents factor Y (%). The analysis method of FIG. 11 is also the same as the analysis method of FIG. 9 described above. Also, it can be clearly understood that there is a critical significance in using a combination of factor X and factor Y corresponding to the white border adjacent to the gray border or the border applied with hatching.

Therefore, also for this frequency band, it is preferable to use a combination of factor X and factor Y corresponding to the white border, and more preferable to use a combination of factor X and factor Y corresponding to the border applied with hatching.

Meanwhile, since the experiment examples shown in FIGS. 9 to 11 are merely specific examples for describing the invention, the resonator 1 according to an embodiment of the present invention may be applied to any frequency band other than these.

6. Modified Examples

In the various embodiments described above, the pitches of the first protrusions 124 and the second protrusions 134 included in the SAW IDT may be almost the same. This is since that the problems related to electrostatic discharge (ESD) and power durability can be suppressed to the maximum. However, in another embodiment, the pitches of the first protrusions 12 and the second protrusions 13 included in the SAW IDT do not necessarily have to be equal to each other (for example, like the second method described above, the pitches of some of the first protrusions 12 and some of the second protrusions 13 may be changed). Even in this case, it is meaningful in that a characteristic of suppressing occurrence of "Spurious" can be obtained in a resonator and a filter using the resonator.

In addition, in the various embodiments described above, a case of decreasing the width of each protrusion existing between one end 100*a* and the first position 100A of the SAW IDT 100 from the first position 100A toward the one end 100*a* and also decreasing the width of each protrusion existing between the other end 100*b* and the second position 100B of the SAW IDT 100 from the second position 100B toward the other end 100*b* has been described as a preferred embodiment. However, in another embodiment, the configuration of decreasing the width of each protrusion in this way may also be applied to "any one side" among each of the protrusions existing between the one end 100*a* and the first position 100A of the SAW IDT 100 and each of the protrusions existing between the other end 100*b* and the second position 100B of the SAW IDT 100. In this case, the protrusions on the other side may have almost the same width.

In addition, in the various embodiments described above, the distance between the one end 100*a* and the first position 100A of the SAW IDT 100 is almost the same as the distance between the other end 100*b* and the second position 100B of the SAW IDT 100 as a preferred embodiment. However, in another embodiment, the distance between the one end 100*a* and the first position 100A of the SAW IDT 100 may be different from the distance between the other end 100*b* and the second position 100B of the SAW IDT 100 (e.g., the former distance>the latter distance, or the former distance<the latter distance).

Furthermore, the resonator according to the various embodiments described above may be mounted on a SAW filter and a SAW resonator.

In addition, the various embodiments described above may be combined with each other as long as there is no contradiction.

Figure 12:
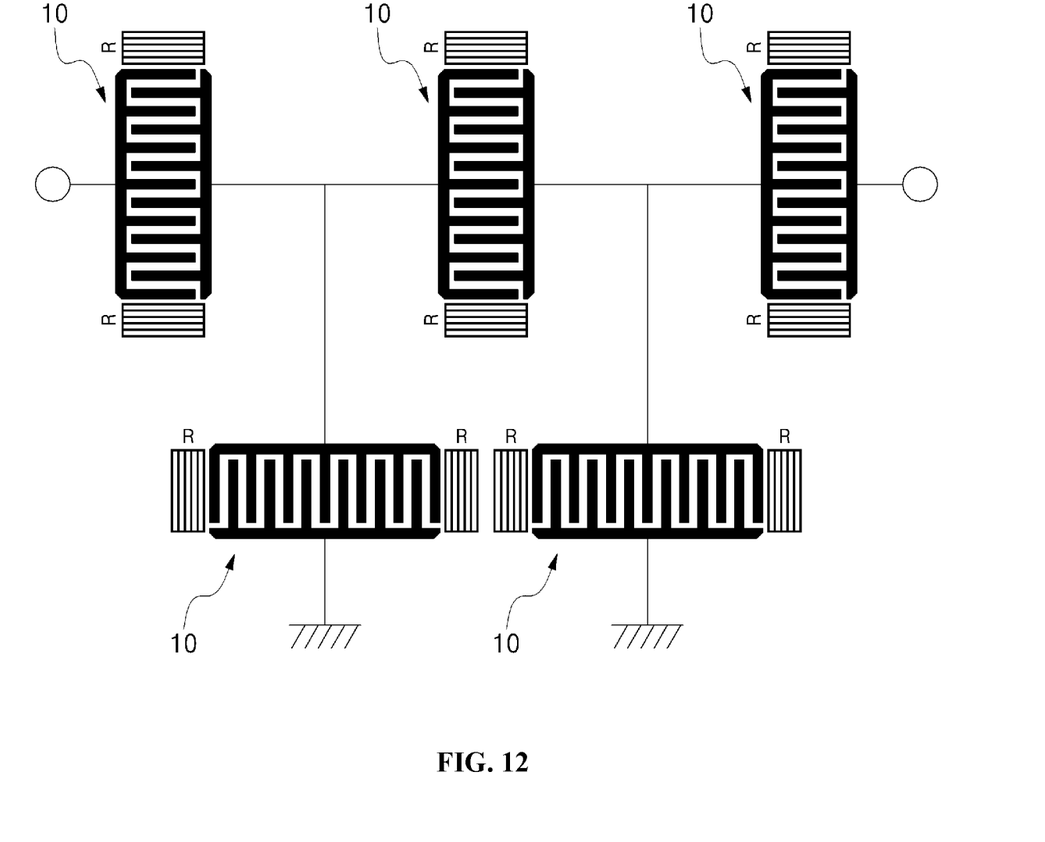
FIG. 12 is a schematic view showing an example of a filter and a duplexer in which the resonator according to the embodiment shown in FIG. 6 is used.
Figure 13:
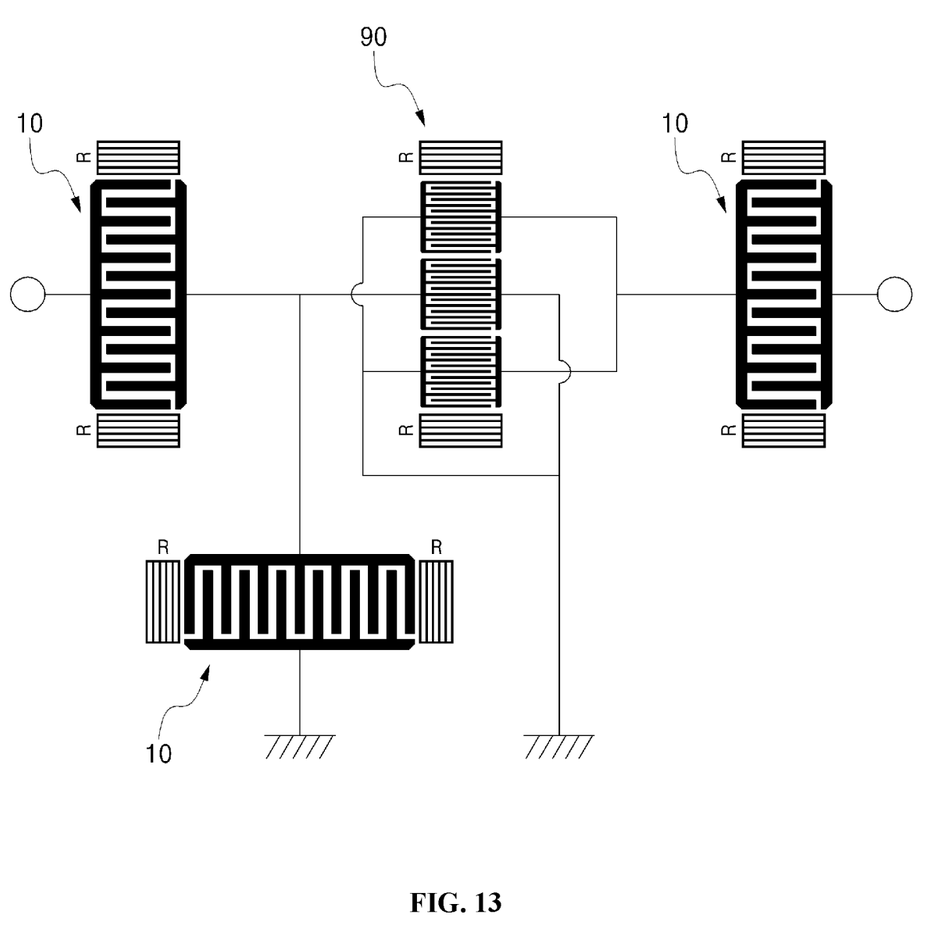
FIG. 13 is a schematic view showing another example of a filter and a duplexer in which the resonator according to the embodiment shown in FIG. 6 is used.

In addition, the resonator according to the various embodiments described above is applicable to any SAW resonator (excluding DMS). For example, as shown in FIG. 12, the resonator according to the various embodiments described above is applicable to each resonator 10 included in a filter or a duplexer of a ladder type in which a plurality of resonators is arranged in parallel and in series (or only in parallel or in series). In addition, as shown in FIG. 13, even in a filter or a duplexer using a Double Mode SAW Filter (DMS) 90, the resonator according to the various embodiments described above is applicable to each resonator 10 included in the filter or the duplexer (not applied to DMS90).

7. Effects

As described above, in the resonator according to various embodiments, it may be installed such that the width of each protrusion located between one end of the SAW IDT and a first position at a first distance from the one end decreases from the protrusion closest to the first position toward the protrusion closest to the one end. In place of or in addition to this, it may be installed such that the width of each protrusion located between the other end of the SAW IDT and a second position at a second distance from the other end decreases from the protrusion closest to the second position toward the protrusion closest to the other end. Accordingly, "Spurious" in the characteristics of a resonator and a filter using the resonator may be reduced by changing the frequency between the one end and the first position and/or the frequency between the other end and the second position.

In addition, degradation of the characteristics related to electrostatic discharge (ESD) and power durability may be suppressed by increasing the gap formed between the first protrusion and the second protrusion existing between the one end and the first position to be adjacent to each other and/or by increasing the gap formed between the first protrusion and the second protrusion existing between the other end and the second position to be adjacent to each other. The related effect may be more remarkable by making the pitches formed between each first protrusion (each second protrusion) existing between the one end and the other end and a first protrusion (second protrusion) adjacent thereto almost the same.

Therefore, according to the various embodiments disclosed in this application, a resonator (surface acoustic wave resonator) with improved performance can be provided.

According to the present invention, a resonator with improved performance and a filter and a duplexer having the resonator can be provided.

According to the present invention, a resonator capable of reducing "Spurious" of a filter can be provided.

According to the present invention, a resonator in which electrostatic discharge (ESD) and power durability characteristics are not degraded can be provided.

The effects of the present invention are not limited to the effects mentioned above, and unmentioned other effects will be clearly understood by those skilled in the art from the description.

Although the embodiments of the present invention have been described with reference to the accompanying drawings, those skilled in the art may understand that the present invention can be implemented in other specific forms without changing the technical spirit or essential features. Therefore, it should be understood that the embodiments described above are illustrative and not restrictive in all respects.

What is claimed is:

1. A resonator comprising:
an interdigital transducer (IDT) including a first electrode including a first base formed on a piezoelectric substrate and extended in a reference direction, and a plurality of first protrusions connected to the first base and extended in a direction intersecting with the reference direction, and a second electrode including a second base formed on the piezoelectric substrate and extended in the reference direction, and a plurality of second protrusions connected to the second base and extended in a direction intersecting with the reference direction, each of the second protrusions being extended to have any one first protrusion among the plurality of first protrusions inserted between the second protrusion and another second protrusion adjacent to the second protrusion, wherein
a width, along the reference direction, of each of a plurality of first specific protrusions included between one end of the IDT and a first position at a first distance from the one end, among the plurality of first protrusions and the plurality of second protrusions, decreases from a first specific protrusion closest to the first position toward a first specific protrusion closest to the one end.

2. The resonator according to claim 1, wherein a width, along the reference direction, of each of a plurality of second specific protrusions included between the other end facing the one end of the IDT and a second position at a second distance from the other end, among the plurality of first protrusions and the plurality of second protrusions, decreases from a second specific protrusion closest to the second position toward a second specific protrusion closest to the other end.

3. The resonator according to claim 2, wherein the width along the reference direction of each of the first protrusions, among the plurality of first protrusions, excluding the plurality of first specific protrusions is almost the same.

4. The resonator according to claim 2, wherein the width along the reference direction of each of the second protrusions, among the plurality of second protrusions, excluding the plurality of second specific protrusions is almost the same.

5. The resonator according to claim 1, wherein a pitch formed between each of the first protrusions and a first protrusion adjacent to the first protrusion is almost the same, and a pitch formed between each of the second protrusions and a second protrusion adjacent to the second protrusion is almost the same.

6. The resonator according to claim 1, further comprising:
a first reflector formed on the piezoelectric substrate to face the one end of the IDT; and
a second reflector formed on the piezoelectric substrate to face the other end of the IDT.

* * * * *